(12) United States Patent
Miyazaki

(10) Patent No.: US 6,335,278 B1
(45) Date of Patent: Jan. 1, 2002

(54) METHOD OF HYDROGEN ANNEAL TO A SEMICONDUCTOR SUBSTRATE

(75) Inventor: Shuji Miyazaki, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/455,909

(22) Filed: Dec. 7, 1999

(30) Foreign Application Priority Data

Dec. 7, 1998 (JP) .......................... 10-347551

(51) Int. Cl.[7] ................................ H01L 21/44
(52) U.S. Cl. .......................... 438/660; 438/770
(58) Field of Search .......................... 438/210, 287, 438/655, 657, 660, 770, 488

(56) References Cited

U.S. PATENT DOCUMENTS 4,154,873 A * 5/1979 Hickox et al. ............ 438/770
4,447,272 A * 5/1984 Saks .......................... 148/1.5
6,232,178 B1 * 5/2001 Yamamoto ................ 438/255

FOREIGN PATENT DOCUMENTS

JP 6344731 2/1988
JP 5129311 5/1993

* cited by examiner

Primary Examiner—David Nelms
Assistant Examiner—Phuc T. Dang
(74) Attorney, Agent, or Firm—Young & Thompson

(57) ABSTRACT

The present invention provides a method of carrying out a hydrogen anneal to a substrate having an interface between different materials provided that an annealing temperature is maintained higher than a hydrogen-eliminating initiation temperature, wherein a temperature of a furnace is controlled to be not higher than the hydrogen-eliminating initiation temperature until the substrate is taken out from the furnace after the hydrogen anneal is carried out.

33 Claims, 13 Drawing Sheets

○ : COMP.EX.1 (400°C)

□ : COMP.EX.2 (420°C)

◇ : COMP.EX.3 (435°C)

× : COMP.EX.4 (450°C)

(1) : DRAM with SAC structure (2) : DRAM free of SAC structure

T : hydrogen-eliminating iniciation temperature

○ : COMP.EX.1 (400°C)

□ : COMP.EX.2 (420°C)

◇ : COMP.EX.3 (435°C)

✕ : COMP.EX.4 (450°C)

○ : COMP.EX.1 (400°C)

× : COMP.EX.4 (450°C)

● : EX.1 (450°C)

■ : EX.2 (480°C)

METHOD OF HYDROGEN ANNEAL TO A SEMICONDUCTOR SUBSTRATE

BACKGROUND OF THE INVENTION

The present invention relates to a method of forming a semiconductor device such as a semiconductor integrated circuit, and more particularly to a method of hydrogen annealing a semiconductor substrate for forming a semiconductor device such as a semiconductor integrated circuit in order to improve device performance and reliability.

To form semiconductor integrated circuits such as memory and logic circuits, various devices are formed on a substrate and then an inter-layer insulator is formed over the substrate, before the substrate is subjected to a hydrogen anneal in a hydrogen-nitrogen atmosphere at a temperature of 400° C.

This hydrogen anneal is effective for improvements in characteristics of electrical connections between metal interconnections and also characteristics of electrical connections between a semiconductor substrate and a metal interconnection. The hydrogen anneal is also effective for improvements in performances and reliability of the semiconductor device and an improvement in yield of the semiconductor device.

In case of dynamic random access memory, interface states are present on an interface of silicon substrate and a silicon oxide film such as a field oxide film and a gate oxide film. A leakage of current from a diffusion layer through this interface state to the substrate is caused, whereby a hold characteristic of the DRAM is deteriorated. The interface state also causes variation in characteristics of the device such as transistors, for example, variations in a threshold voltage and a current-voltage characteristic from designed values. This interface state makes it difficult to improve the yield and reliability of the semiconductor device. The hydrogen anneal is effective to obtain desired characteristics of the transistors such as threshold voltage and current-voltage characteristic for other semiconductor devices than the DRAM, for example, logic devices. The interface states are caused by dangling bond of silicon near the interface between silicon and silicon interface. The hydrogen anneal supplies hydrogen to the interface between silicon oxide so that the dangling bond is terminated with hydrogen supplied, whereby the interface state is reduced.

In recent years, scaling down and increase in density of integration of the semiconductor integrated circuits have been on the increase. Further, a multilayer structure has been on development. Furthermore, new multilayer structures, electrode materials, interconnection materials and insulator materials have been developed and used. These new conditions make it difficult to penetrate and diffuse hydrogen to the interface between silicon and silicon oxide through the hydrogen anneal. In order to solve this difficulty, it is necessary to make an anneal time longer and to rise an anneal temperature. If the anneal time becomes longer, then a problem with reduction in productivity of the semiconductor device is raised. If the anneal temperature is risen, spikes or hillocks are caused on metal interconnection such as an aluminum interconnection, whereby the reliability is deteriorated. Furthermore, the temperature increase does not necessarily cause desired effects of the hydrogen anneal.

The permeability of hydrogen depends upon materials of the device. For example, permeability of hydrogen to silicon oxide films such as the inter-layer insulator and the field oxide film are relatively high. A permeability of silicon nitride film which may often be used as an etching stopper and a dielectric film of a capacitor as well as a contamination control film is low. Particularly, a silicon nitride film deposited by a low pressure chemical vapor deposition method has a high film density, for which reason the silicon nitride film serves as a diffusion barrier to diffusion of hydrogen.

Metal materials such as aluminum for metal interconnections absorb hydrogen. Barrier material materials such as Ti and TiN also absorb hydrogen. Further, polysilicon used for interconnection and electrodes also absorb hydrogen. Namely, hydrogen is absorbed into the metal interconnection materials, the barrier metal materials, and polysilicon whereby the diffusion rate is remarkable reduced until the absorption is saturated to allow hydrogen to permeate those materials.

On the other hand, it is possible to consider that hydrogen penetrates from a bottom of a substrate. However, in recent years, a wafer diameter has been on the increase whereby a thickness of the wafer has also been on the increase. For example, 6-inch wafer has a thickness of 675 micrometers. 8-inch wafer has a thickness of 725 micrometers. 12-inch wafer has a thickness of over 770 micrometers. The increase in thickness of the wafer means that the necessary diffusion depth is increased, thereby making it difficult to penetrate hydrogen from the substrate bottom surface to the interface between silicon and silicon oxide. Further, when a polysilicon film and a silicon nitride film which serve as diffusion barriers to hydrogen are formed, those films are also formed or adhered on the bottom surface of the substrate, whereby it is no longer possible that hydrogen is diffused from the bottom surface of the substrate to the interface between silicon and silicon oxide. Furthermore, in case, a polysilicon film which serves as the diffusion barrier to hydrogen is formed on the bottom surface of the substrate for extrinsic gettering, whereby it is also no longer possible that hydrogen is diffused from the bottom surface of the substrate to the interface between silicon and silicon oxide. Moreover, the deep diffusion depth from the bottom surface of the substrate needs a high temperature hydrogen anneal.

The difficulty in application of the hydrogen anneal to the advanced semiconductor devices will be described with reference to the drawings. FIG. 1A is a fragmentary plan view illustrative of a stacked DRAM. FIG. 1B is a fragmentary cross sectional elevation view illustrative of a stacked DRAM taken along a B—B line of FIG. 1A. FIG. 1C is a fragmentary cross sectional elevation view illustrative of a stacked DRAM taken along a C—C line of FIG. 1A. Field oxide films 2 are selectively formed on a surface of a p-type silicon substrate 1 which has a predetermined crystal orientation. Silicon nitride films 6 are formed over the field oxide films 2. Diffusion layers 5 are selectively formed in an active region of the silicon substrate 1 defined by the field oxide film 2. Gate oxide films 4 of silicon oxide are formed on the active region of the silicon substrate 1. Gate electrodes 3 are formed on the gate oxide films 4. Each gate of the electrodes 3 comprises laminations of a n-type polysilicon film and a tungsten silicide film which are not illustrated. The diffusion layers 5 are self-aligned to the gate electrodes 3 and the field oxide films 2. Silicon nitride films 6 are formed on side walls of the gate electrodes 3. n-type polysilicon pads 9 are formed on the diffusion layers 5 and between the side wall silicon nitride films 6. The n-type polysilicon pads 9 are formed by an anisotropic selective epitaxial growth. A silicon oxide interlayer insulator 7 is formed over the gate electrodes 3, the side wall silicon nitride films 6. Contact holes are formed in the silicon oxide inter-layer insulator 7, so that the contact holes are positioned just over the n-type polysilicon pads 9. n-type polysilicon contacts 8 are filled within the contact holes so that the n-type polysilicon contacts 8 are made into contact with the n-type polysilicon pads 9, whereby the n-type polysilicon contacts 8 are electrically connected through the n-type polysilicon pads 9 to the diffusion layers 5. Capacitive bottom electrodes 10 are selectively formed over the silicon oxide inter-layer insulator 7, so that the capacitive bottom electrodes 10 are made into contact with the n-type polysilicon contacts 8, whereby the capacitive bottom electrodes 10 are electrically connected through the n-type polysilicon pads 9 and the n-type polysilicon contacts 8 to the diffusion layers 5. The capacitive bottom electrodes 10 are made of polysilicon. A capacitive insulating film 11 is formed on top and side surfaces of the capacitive bottom electrodes 10 and on top surfaces of the silicon oxide inter-layer insulator 7. The capacitive insulating film 11 comprises laminations of a silicon oxide film, a silicon nitride film and a silicon oxide film. A capacity top electrode 12 made of polysilicon is formed on the capacitive insulating film 11. Further, an additional inter-layer insulator is not illustrated is formed over the capacitive top electrode 12. Bit lines not illustrated are further formed over the additional inter-layer insulator. The capacitive bottom electrodes 10 are divided for every transistors formed on the surface of the substrate 1. The capacitive top electrode 12 are divided for every cell array units.

The above substrate for the stacked DRAM is then subjected to the hydrogen anneal. Hydrogen atoms supplied from the hydrogen atmosphere are first absorbed into the bit lines which are made of polysilicon. The remaining hydrogen atoms are then absorbed into the polysilicon capacitive top electrode 12. The remaining hydrogen atoms penetrate through the inter-layer insulator 7 and then reach interfaces between the top surface of the silicon substrate 1 and the gate oxide films 4 and the interfaces between the top surface of the silicon substrate 1 and the field oxide films 2. Even illustration is omitted, if the stacked DRAM has a capacitor over bit line structure where the polysilicon bit lines are provided between levels of the capacitive bottom electrodes 10 and the transistors or the gate electrodes 3, the remaining hydrogen atoms are absorbed into these polysilicon bit lines.

As the increase in the high density of the integration of the semiconductor devices and the scaling down thereof cause that occupied areas of the bit lines and word lines in a unit area are increased and further a distance between the adjacent cell arrays is made narrow. Those structures make it difficult to have hydrogen to reach the interface between silicon and silicon oxide by the hydrogen anneal.

In 16M-bit DRAM having a capacitor under bit line structure, contacts are formed between the bit lines and the diffusion layers in the substrate. These contacts serve as diffusion paths of hydrogen. In 16M-bit shrinking DRAM having the capacitor over bit line structure, the bit lines are positioned under the capacitive bottom electrodes, for which reason no contact is formed in the opening, whereby diffusion paths are present in gaps between the capacitive bottom electrodes. The 64M-bits DRAM or 64M-bits shrinking DRAM is further scaled down and has a higher density of integration, whereby gaps between the bit lines and the word lines as well as gaps between the capacitive bottom electrodes are made further narrow.

FIG. 2 is a fragmentary cross sectional elevation view illustrative of a stacked DRAM having a self-aligned contact structure and a capacitor over bit line structure in a unit of one of the capacitive top electrodes. FIG. 3 is a fragmentary plan view illustrative of a DRAM chip of FIG. 2. A silicon nitride film 6 is formed over gate electrodes 3 and field oxide films 2 in order to protect the gate electrodes 3 and the field oxide films 2 from a dry etching process to form contact holes in an inter-layer insulator 7 over the field oxide film 2 and the gate electrodes 4. The silicon nitride film 6 is selectively removed under the contact holes before contacts 8 are formed in the contact holes so that the contacts 8 are made into contact with surfaces of diffusion layers 5 in a silicon substrate 1. The bottom surface of the silicon substrate 1 is also covered by or adhered with a silicon nitride film at the same time when the silicon nitride film 6 is formed over the gate electrodes 4 and the field oxide films 2. Interfaces between the silicon substrate 1 and the field oxide films 2 and interfaces between the silicon substrate 1 and the gate oxide films 3 are shielded by the silicon nitride films which serve as the diffusion barriers to hydrogen supplied from the hydrogen atmosphere in the hydrogen anneal, for which reason it is difficult to have hydrogen to reach those interfaces.

Further, capacitive bottom electrodes 10 are provided for every transistors whilst capacitive top electrodes 11 are provided for every cell array units, for which reason diffusion path of hydrogen is only in gaps between the capacitive top electrodes 12.

Further more, the DRAM has the capacitance over bit line structure, wherein polysilicon bit lines 13 are provided at a level between the capacitive bottom electrodes 10 and the transistors. The hydrogen atoms having penetrated through the gaps between the capacitive top electrodes 10 are further absorbed into the polysilicon bit lines 13.

FIG. 4 is a diagram illustrative of a variation in leak current over a hydrogen anneal time when a silicon substrate of FIG. 1 is subjected to a hydrogen anneal in the conventional method. The anneal is carried out in a hydrogen atmosphere of a hydrogen to nitrogen ratio of 1:1 under atmospheric pressure at a constant temperature of 400° C. The leakage of current is measured under conditions that transistors of all unit cell blocks are connected in parallel. Four types of the stacked DRAMs are subjected to the above hydrogen anneal to measure the leakage of current. The first type of DRAM (a) is 16M-bits DRAM. The second type of DRAM (b) is 16M-bits shrinking DRAM. The third type of DRAM (c) is 64M-bits DRAM. The fourth type of DRAM (d) is 64M-bits shrinking DRAM. FIG. 4 shows that the advanced higher density DRAM such as the 64M-bits shrinking DRAM needs longer time hydrogen anneal to suppress the leakage of current.

FIG. 5 is a diagram illustrative of variation in reverse current versus reverse voltage of each of a first type stacked DRAM (1) having a self-aligned contact structure and a second type stacked DRAM (2) free of any self-aligned contact structure after the first and second type DRAMs have been subjected to the hydrogen anneals. The hydrogen anneal is carried out at a hydrogen-nitrogen atmosphere of a hydrogen to nitrogen ratio of 1:1 at a constant temperature of 400° C. under an atmospheric pressure. In order to measure the reverse current, a reverse bias is applied to a p-n junction between contacts and substrate, where the contacts have a diameter of 0.5 micrometers and are aligned to form an array. The first type stacked DRAM (1) having the self-aligned contact structure is subjected to the hydrogen anneal for a longer time, for example, 240 minutes whilst the second type stacked DRAM (2) free of any self-aligned contact structure is subjected to the hydrogen anneal for a shorter time, for example, 40 minutes. The leakage of reverse current of the first type stacked DRAM (1) having the self-aligned contact structure is remarkably larger than the leakage of reverse current of the second type stacked DRAM (2) free of any self-aligned contact structure. This shows that it is difficult to have hydrogen penetrate and diffuse to reach the interface between silicon and silicon oxide of the first type stacked DRAM (1) as compared to the second type stacked DRAM (2).

In the above circumstances, it had been required to develop a novel method of hydrogen anneal to a substrate free from the above problem.

SUMMARY OF THE INVENTION

Accordingly, it is an object of the present invention to provide a novel method of hydrogen anneal to a substrate free from the above problems.

It is a further object of the present invention to provide a novel method of hydrogen anneal to a substrate, which is capable of improvement in characteristic of a semiconductor device.

It is a still further object of the present invention to provide a novel method of hydrogen anneal to a substrate, which is capable of improvement in reliability of a semiconductor device.

It is yet a further object of the present invention to provide a novel method of hydrogen anneal to a substrate, which is capable of improvement in yield of a semiconductor device.

The present invention provides a method of carrying out a hydrogen anneal to a substrate having an interface between different materials provided that an annealing temperature is maintained higher than a hydrogen-eliminating initiation temperature, wherein a temperature of a furnace is controlled to be not higher than the hydrogen-eliminating initiation temperature until the substrate is taken out from the furnace after the hydrogen anneal is carried out. The hydrogen-eliminating initiation temperature is defined to be a temperature at which hydrogen having once terminated dangling bonds of interface states on an interface between different materials are initiated to be eliminated. The above novel temperature control is made in order to prevent hydrogen from being eliminated from dangling bonds of interface states on the interface, so that no interface state is formed on the interface, whereby a sufficient reduction in amount of the interface states on the interface is obtained, resulting in improvements in device performances and characteristics and reliability thereof as well as an improvement in the yield of the semiconductor devices.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DESCRIPTION OF THE PREFERRED EMBODIMENT

Figure 1A:
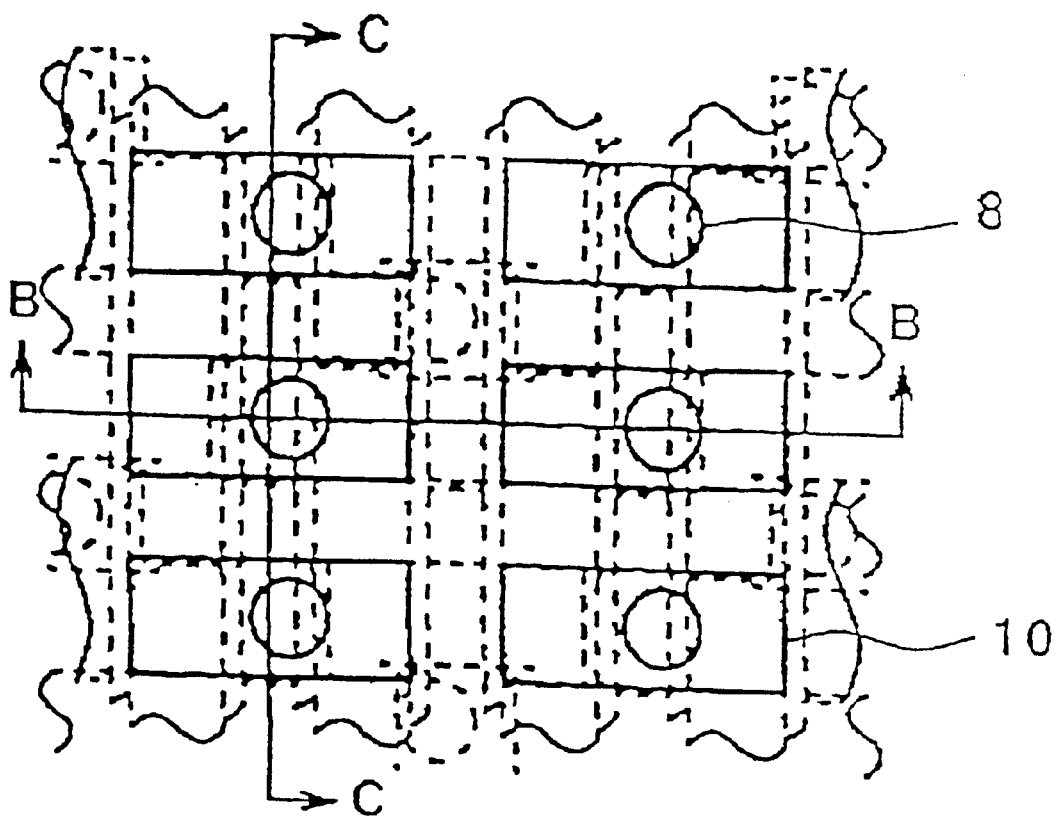
FIG. 1A is a fragmentary plan view illustrative of a stacked DRAM.
Figure 1B:
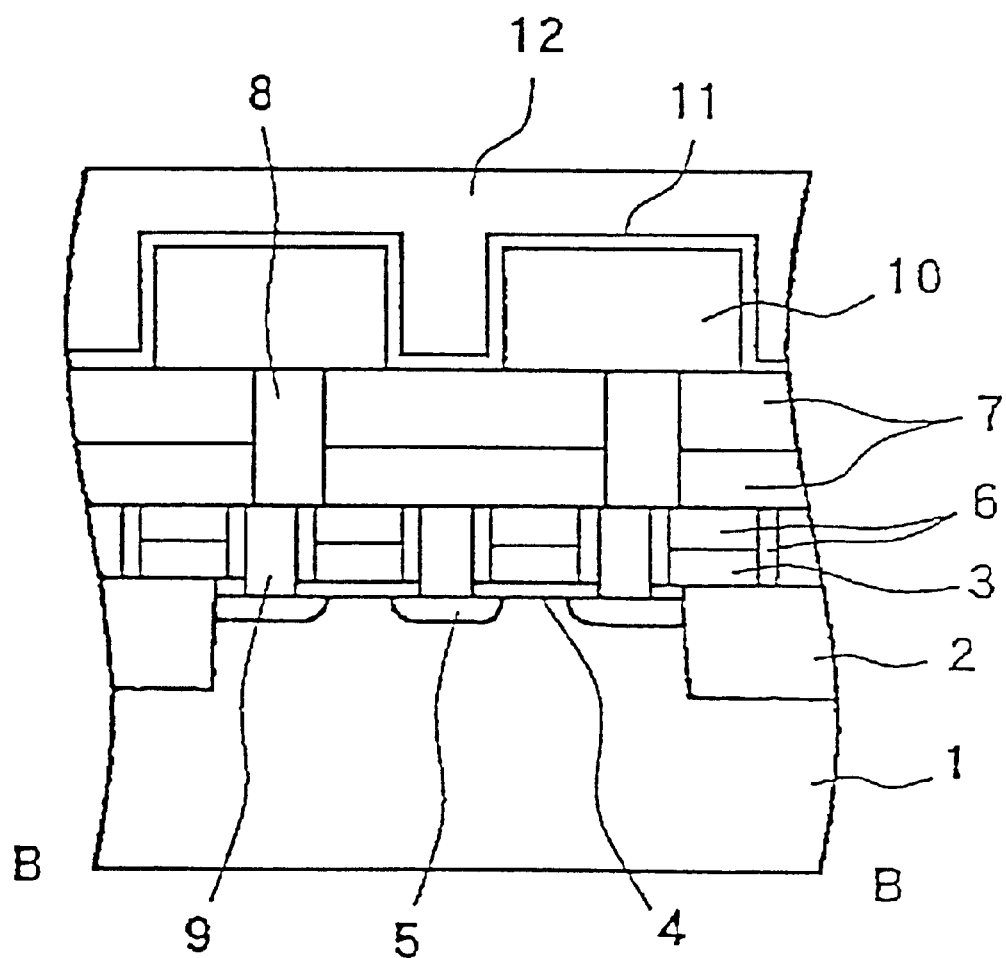
FIG. 1B is a fragmentary cross sectional elevation view illustrative of a stacked DRAM taken along a B—B line of FIG. 1A.
Figure 1C:
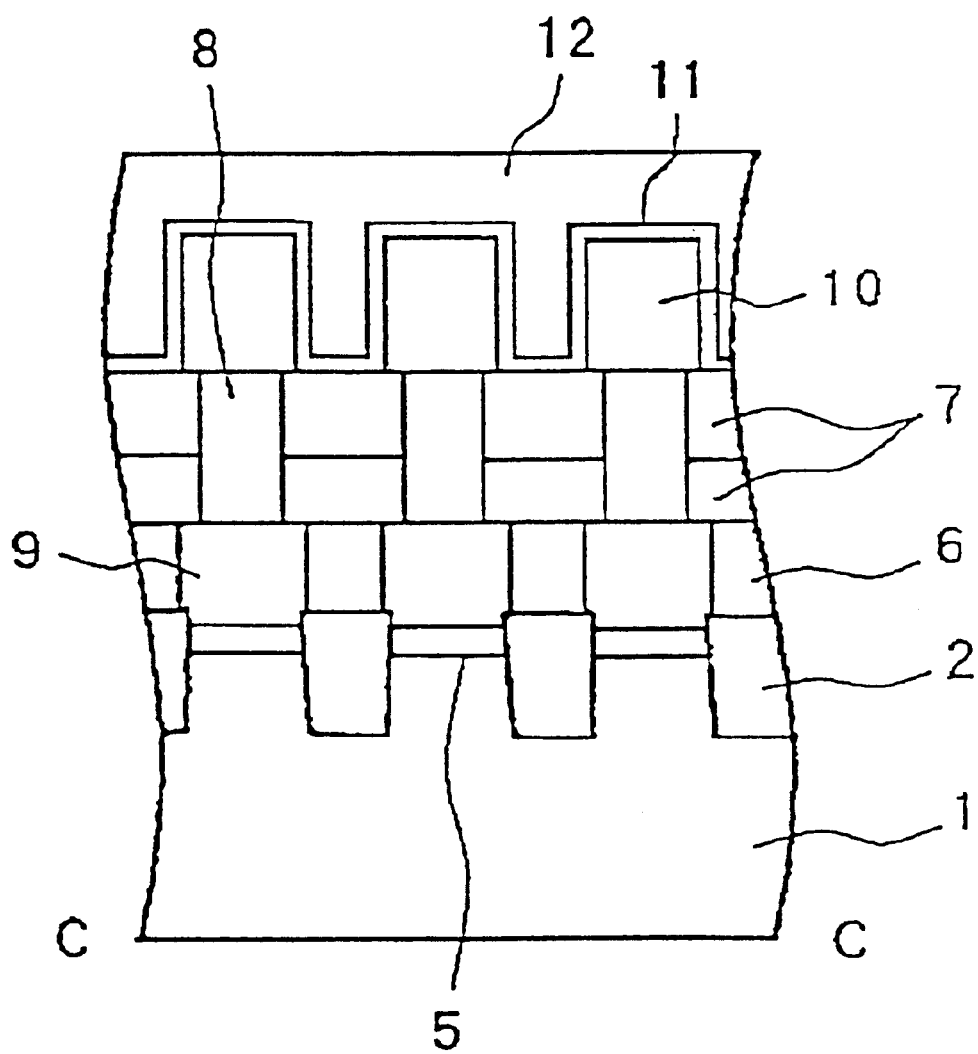
FIG. 1C is a fragmentary cross sectional elevation view illustrative of a stacked DRAM taken along a C—C line of FIG. 1A.

The present invention provides a method of hydrogen annealing a semiconductor substrate by controlling a temperature of a furnace to be not higher than a hydrogen-eliminating initiation temperature until a substrate having an interface between different materials is taken out from the furnace after a hydrogen anneal is carried out in the furnace with an anneal temperature profile which includes at least a higher temperature than the hydrogen-eliminating initiation temperature. They hydrogen-eliminating initiation temperature is defined to be a temperature at which hydrogen having once terminated dangling bonds of interface states on an interface between different materials are initiated to be eliminated.

The above novel temperature control is made in order to prevent hydrogen from being eliminated from dangling bonds of interface states on the interface, so that no interface state is formed on the interface, whereby a sufficient reduction in amount of the interface states on the interface is obtained, resulting in improvements in device performances and characteristics and reliability thereof as well as an improvement in the yield of the semiconductor devices.

It is preferable that the temperature of the furnace is decreased to be not higher than the hydrogen-eliminating initiation temperature before a hydrogen atmosphere in the furnace is changed to an inert atmosphere prior to taking the substrate out from the furnace.

It is also preferable that the temperature of the furnace is kept constant at the hydrogen-eliminating initiation temperature until the substrate is taken out from the furnace after the hydrogen anneal is carried out.

It is also preferable that the temperature of the furnace is decreased from the hydrogen-eliminating initiation temperature until the substrate is taken out from the furnace after the hydrogen anneal is carried out. It is further preferable that the temperature of the furnace is decreased in proportion to time.

It is also preferable that the anneal temperature profile includes a time period during when the temperature of the furnace is kept to be higher than the hydrogen-eliminating initiation temperature.

It is also preferable that the anneal temperature profile includes a first time period during when the temperature of the furnace is kept constant at a higher temperature than the hydrogen-eliminating initiation temperature and a second time period during when the temperature of the furnace is decreased to be not higher than the hydrogen-eliminating initiation temperature. It is further preferable that the temperature of the furnace is decreased and maintained at the hydrogen-eliminating initiation temperature. It is further more preferable that the temperature of the furnace is maintained at the hydrogen-eliminating initiation temperature for a predetermined time period before a hydrogen atmosphere in the furnace is changed to an inert atmosphere prior to taking the substrate out from the furnace.

It is also preferable that the temperature of the furnace is decreased from the higher temperature than the hydrogen-eliminating initiation temperature to a lower temperature than the hydrogen-eliminating initiation temperature. It is further preferable that the temperature of the furnace is decreased in proportion to time.

It is also preferable that the interface is an interface between semiconductor and insulator. It is further preferable that the interface is an interface between silicon and silicon oxide.

It is also preferable that the substrate has at least a film made of a material capable of absorbing hydrogen.

It is also preferable that the substrate has at least a film made of a material non-permeable to hydrogen serving as a diffusion barrier to hydrogen.

A second aspect of the present invention provides a method of controlling a substrate temperature to be not higher than a hydrogen-eliminating initiation temperature until a substrate having an interface between different materials is taken out from the furnace after a hydrogen anneal is carried out in the furnace with an anneal temperature profile which includes at least a higher temperature than the hydrogen-eliminating initiation temperature. The hydrogen-eliminating initiation temperature is defined to be a temperature at which hydrogen having once terminated dangling bonds of interface states on an interface between different materials are initiated to be eliminated.

The above novel temperature control is made in order to prevent hydrogen from being eliminated from dangling bonds of interface states on the interface, so that no interface state is formed on the interface, whereby a sufficient reduction in amount of the interface states on the interface is obtained, resulting in improvements in device performances and characteristics and reliability thereof as well as an improvement in the yield of the semiconductor devices.

The third present invention provides a method of carrying out a hydrogen anneal to a substrate having an interface between different materials provided that an annealing temperature is maintained higher than a hydrogen-eliminating initiation temperature, wherein a temperature of a furnace is controlled to be not higher than the hydrogen-eliminating initiation temperature until the substrate is taken out from the furnace after the hydrogen anneal is carried out. The hydrogen-eliminating initiation temperature is defined to be a temperature at which hydrogen having once terminated dangling bonds of interface states on an interface between different materials are initiated to be eliminated.

The above novel temperature control is made in order to prevent hydrogen from being eliminated from dangling bonds of interface states on the interface, so that no interface state is formed on the interface, whereby a sufficient reduction in amount of the interface states on the interface is obtained, resulting in improvements in device performances and characteristics and reliability thereof as well as an improvement in the yield of the semiconductor devices.

It is preferable that the temperature of the furnace is decreased to be not higher than the hydrogen-eliminating initiation temperature before a hydrogen atmosphere in the furnace is changed to an inert atmosphere prior to taking the substrate out from the furnace.

It is also preferable that the temperature of the furnace is kept constant at the hydrogen-eliminating initiation temperature until the substrate is taken out from the furnace after the hydrogen anneal is carried out.

It is also preferable that the temperature of the furnace is decreased from the hydrogen-eliminating initiation temperature until the substrate is taken out from the furnace after the hydrogen anneal is carried out. It is further preferable that the temperature of the furnace is decreased in proportion to time.

It is also preferable that the anneal temperature profile includes a time period during when the temperature of the furnace is kept to be higher than the hydrogen-eliminating initiation temperature.

It is also preferable that the anneal temperature profile includes a first time period during when the temperature of the furnace is kept constant at a higher temperature than the hydrogen-eliminating initiation temperature and a second time period during when the temperature of the furnace is decreased to be not higher than the hydrogen-eliminating initiation temperature. It is further preferable that the temperature of the furnace is decreased and maintained at the hydrogen-eliminating initiation temperature. It is further more preferable that the temperature of the furnace is maintained at the hydrogen-eliminating initiation temperature for a predetermined time period before a hydrogen atmosphere in the furnace is changed to an inert atmosphere prior to taking the substrate out from the furnace.

It is also preferable that the temperature of the furnace is decreased from the higher temperature than the hydrogen-eliminating initiation temperature to a lower temperature than the hydrogen-eliminating initiation temperature. It is further preferable that the temperature of the furnace is decreased in proportion to time.

It is also preferable that the interface is an interface between semiconductor and insulator. It is further preferable that the interface is an interface between silicon and silicon oxide.

It is also preferable that the substrate has at least a film made of a material capable of absorbing hydrogen.

It is also preferable that the substrate has at least a film made of a material non-permeable to hydrogen serving as a diffusion barrier to hydrogen.

Figure 6:
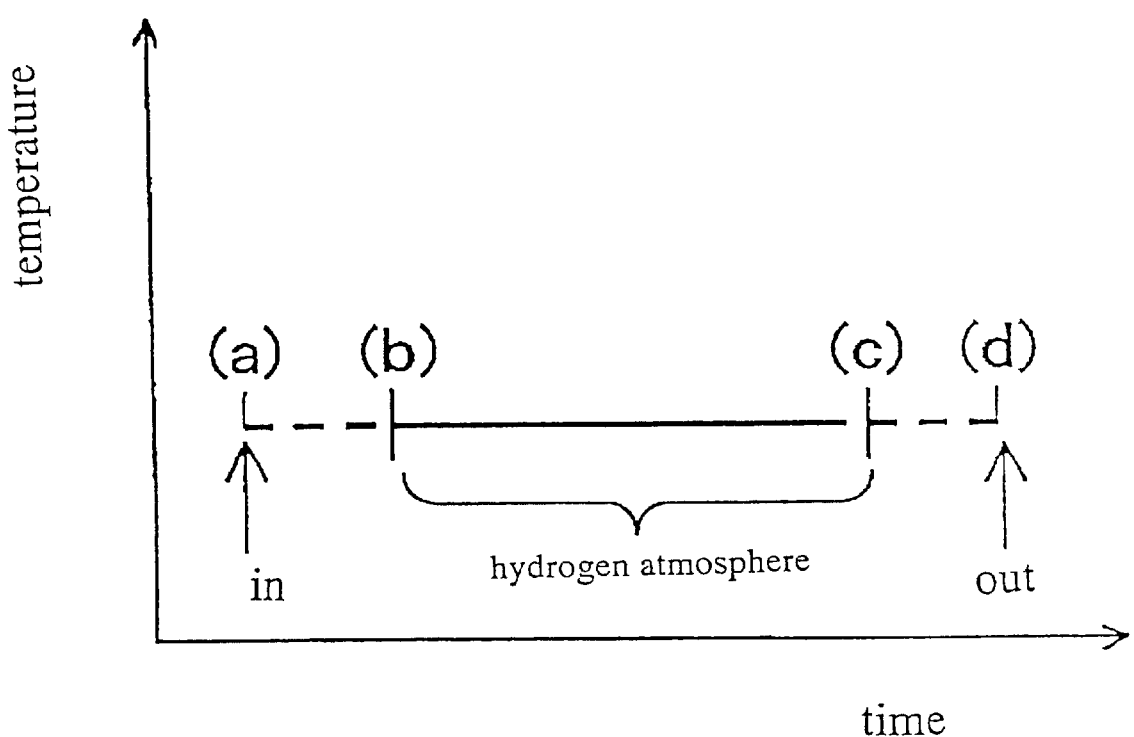
FIG. 6 is a diagram illustrative of the conventional method of hydrogen anneal.

In order to distinguish the present invention from the conventional hydrogen anneal method, the conventional method of hydrogen anneal will subsequently be described with reference to the drawings in order to compare the above novel method of hydrogen anneal in accordance with the present invention with the conventional method of hydrogen anneal. FIG. 6 is a diagram illustrative of the conventional method of hydrogen anneal. The substrate is placed into a nitrogen atmosphere of a furnace at a time (a), wherein the furnace is heated at a constant temperature of 400° C. The furnace is kept until a time (b). At the time (b), with keeping the temperature, the nitrogen atmosphere is changed to a hydrogen atmosphere for carrying out a hydrogen anneal to the substrate until a time (c). At the time (c), with keeping the temperature, the hydrogen atmosphere is changed to a nitrogen atmosphere. At the time (d), the substrate is taken out from the furnace. There is no limitation to the temperature of the furnace when the substrate is placed into and taken out from the furnace if the furnace has an inert atmosphere such as the atmosphere or the nitrogen atmosphere. If, however, a plurality of the substrates are sequentially processed in the furnace, it is preferable to keep the same temperature as of the hydrogen anneal even before the substrate is placed into the furnace and even after the substrate is taken out from the furnace.

Figure 7:
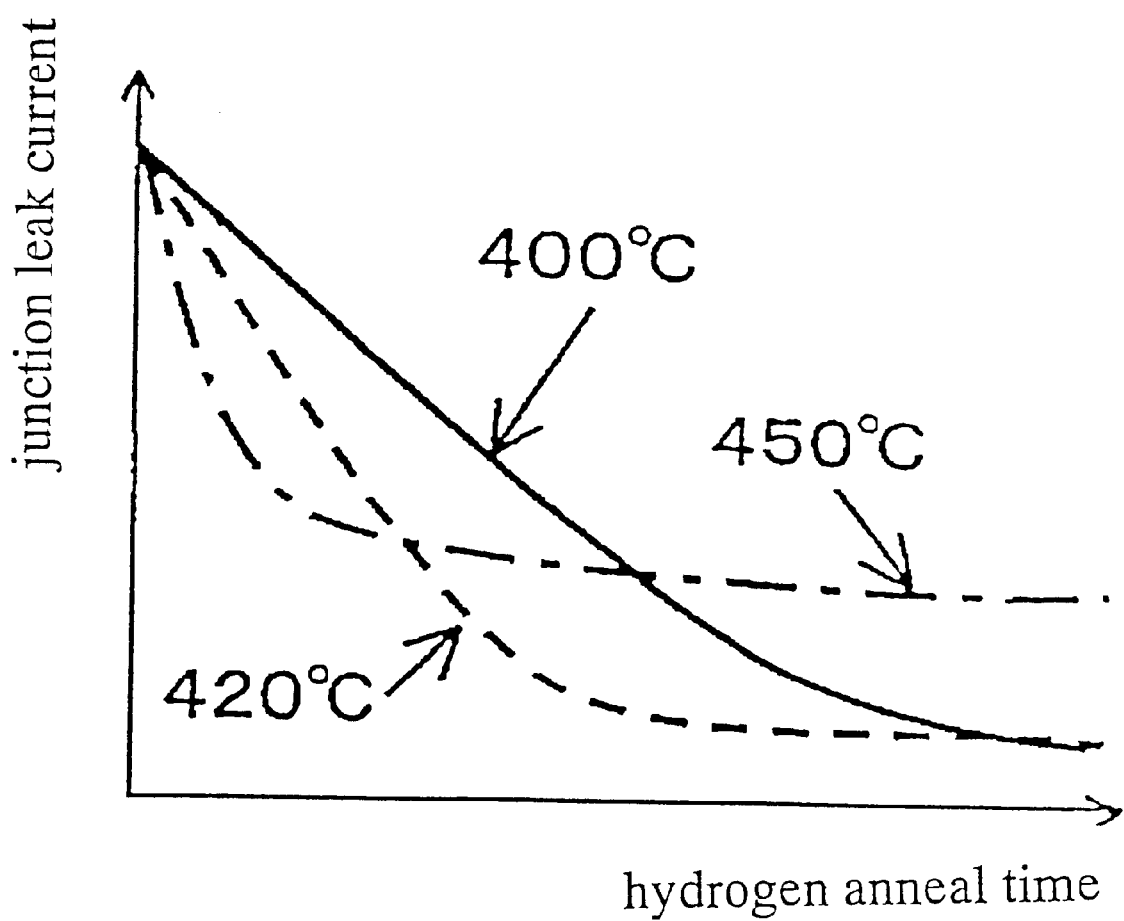
FIG. 7 is a diagram illustrative of a variation in junction leak current over a hydrogen anneal time when the conventional hydrogen anneal of FIG. 6 is carried out to a DRAM having silicon oxide films but free of silicon nitride film at various temperatures.

FIG. 7 is a diagram illustrative of a variation in junction leak current over a hydrogen anneal time when the conventional hydrogen anneal of FIG. 6 is carried out to a DRAM having silicon oxide films but free of silicon nitride film at various temperatures. Vertical and horizontal axes are represented with relative values. The variation in junction leak current over a hydrogen anneal time of the hydrogen anneal carried out at a temperature of 400° C. is represented by a real line. The variation in junction leak current over a hydrogen anneal time of the hydrogen anneal carried out at a temperature of 420° C. is represented by a dotted line. The variation in junction leak current over a hydrogen anneal time of the hydrogen anneal carried out at a temperature of 450° C. is represented by a broken line.

As the anneal temperature is increased from 400° C. to 420° C., then the diffusion rate of hydrogen is increased, whereby a drop rate of the junction leak current is faster. This means that the hydrogen anneal carried out at the temperature of 420° C. is capable of reducing the interface state in a relatively short time. The high temperature hydrogen anneal shortens the necessary anneal time. As the anneal temperature is increased from 420° C. to 450° C., then the diffusion rate of hydrogen is further increased, whereby the drop rate of the junction leak current is further faster. However, the finally reduced junction leak current is higher than when the hydrogen anneal is carried out at the lower temperature of 400° C. or 420° C. This means that the hydrogen anneal carried out at the temperature of 450° C. is incapable of sufficient reduction of the interface state.

The reason why the increase in the temperature from 420° C. to 450° C. in the conventional hydrogen anneal is incapable of sufficient reduction in the junction leak current has been investigated by the present inventor and could be confirmed in the fact that the substrate is taken out from the furnace at the high temperature of the furnace.

As described above, the hydrogen atmosphere used for the hydrogen anneal is changed into the inert atmosphere such as air or the nitrogen atmosphere before the substrate is taken out from the furnace kept at the high temperature. If the substrate is kept in the high temperature even after the hydrogen anneal has been carried out in accordance with the above conventional hydrogen anneal method, then the hydrogen, which has once reached to the interface between the silicon substrate and the silicon oxide films to have reduced the interface state, is then eliminated from the interface, whereby the interface states are again formed on the hydrogen-eliminated interface between the silicon substrate and the silicon oxide films. As shown in FIG. 7, if the anneal temperature of the hydrogen anneal is over 420° C., the reduction in the junction leak current is insufficient. This means that if the substrate is kept in the high temperature of over 420° C., for example, 450° C. even after the hydrogen anneal has been carried out in accordance with the above conventional hydrogen anneal method, then the hydrogen, which has once reached to the interface between the silicon substrate and the silicon oxide films to have reduced the interface state, is then eliminated from the interface, whereby the interface states are again formed on the hydrogen-eliminated interface between the silicon substrate and the silicon oxide films. This temperature of 420° C. may be considered to be a hydrogen-eliminating initiation temperature.

In accordance with the novel hydrogen anneal method of the present invention, after the hydrogen anneal has been carried out, then the furnace temperature is dropped from the hydrogen anneal temperature to a temperature lower than a hydrogen-eliminating initiation temperature before the hydrogen atmosphere in the furnace is changed to an inert atmosphere for taking the substrate out from the furnace, wherein the hydrogen-eliminating initiation temperature is defined to be a temperature at which hydrogen having once terminated dangling bonds of interface states on an interface of silicon and silicon oxide are initiated to be eliminated. Namely, the hydrogen anneal is carried out in the hydrogen atmosphere at a hydrogen anneal temperature which is higher than the hydrogen-eliminating initiation temperature before the substrate temperature is dropped in the hydrogen atmosphere from the hydrogen anneal temperature to a temperature lower than the hydrogen-eliminating initiation temperature in order to prevent hydrogen from being eliminated from the dangling bonds of interface states on the interface between silicon substrate and silicon oxide films, so that no interface state is formed on the interface.

In more detail, in accordance with the present invention, the hydrogen anneal is carried out in the hydrogen atmosphere at a higher temperature than the hydrogen-eliminating initiation temperature in order to cause an increased diffusion rate of hydrogen for having hydrogen reach the interface between silicon and silicon oxide to terminate dangling bonds of the interface states on the interface, thereby obtaining a faster reduction of the interface states on the interface between silicon and silicon oxide in a shortened time period. After the hydrogen anneal has been carried out in the hydrogen atmosphere, then, with keeping the hydrogen atmosphere, the hydrogen anneal temperature of the substrate is then decreased to a temperature lower than the hydrogen-eliminating initiation temperature in order to prevent hydrogen from being eliminated from the dangling bonds of the interface states on the interface between silicon substrate and silicon oxide films, so that no interface state is formed on the interface. As a result, a sufficient reduction in amount of the interface states on the interface between silicon and silicon oxide is obtained. The novel method of hydrogen anneal is applicable to various types of semiconductor devices in order to improve device performances and characteristics and reliability thereof as well as improve the yield of the semiconductor devices.

Figure 8:
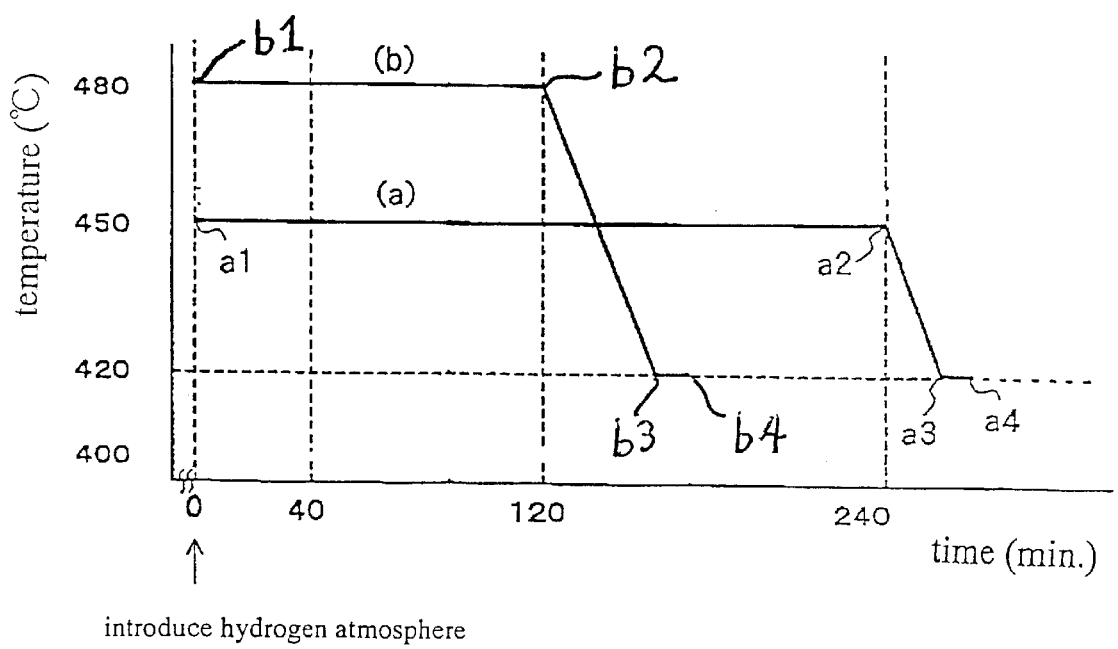
FIG. 8 is a diagram illustrative of a desirable sequence of hydrogen anneal temperature over time during when and after carrying out each of first and second novel methods of hydrogen anneal at two different temperature variation profiles in accordance with the present invention.

FIG. 8 is a diagram illustrative of a desirable sequence of hydrogen anneal temperature over time during when and after carrying out each of first and second novel methods of hydrogen anneal at two different temperature variation profiles in accordance with the present invention. The real line (a) represents a desirable sequence of hydrogen anneal temperature over time in a first case that the hydrogen anneal is carried out at a temperature of 450° C. which is higher than the hydrogen-eliminating initiation temperature of 420° C. The other real line (b) represents a desirable sequence of hydrogen anneal temperature over time in a second case that the hydrogen anneal is carried out at a temperature of 480° C. which is higher than the hydrogen-eliminating initiation temperature of 420° C.

In the first case (a), a furnace is heated up to a first annealing temperature of 450° C. which is higher than the hydrogen-eliminating initiation temperature of 420° C. before a substrate is placed into the heated furnace, wherein the furnace has an inert gas atmosphere such as an air or a nitrogen atmosphere. With keeping the temperature of the furnace to be constant at the first annealing temperature, the inert atmosphere in the furnace is changed to a hydrogen atmosphere in order to start a hydrogen anneal to the substrate in the hydrogen atmosphere at the first annealing temperature. Changing the inert atmosphere to the hydrogen atmosphere is completed at a time "0". The hydrogen anneal is thus carried out in the hydrogen atmosphere with keeping the furnace temperature to be constant at the first annealing temperature of 450° C. for 240 minutes in a first time period between "a1" and "a2". The hydrogen anneal is further continued with a gradual and proportional decrease in the furnace temperature from 450° C. to 420° C. in a second time period between "a2" and "a3". The substrate is then placed in the furnace kept at the constant temperature of 420° C. for a time period from the "a3 to a time "a4". At the time "a4", the hydrogen atmosphere in the furnace is changed into an inert atmosphere at 420° C. which is not higher than the hydrogen-eliminating initiation temperature, in order to discontinue the hydrogen anneal, before the substrate is taken out form the furnace which has the lower temperature than the hydrogen-eliminating initiation temperature.

Namely, in the first case, the hydrogen anneal is carried out at 450° C. which is higher than the hydrogen-eliminating initiation temperature and then the furnace temperature remains controlled to be not higher than the hydrogen-eliminating initiation temperature after the hydrogen anneal has been carried out and until the substrate is taken out from the furnace, in order to prevent hydrogen from being eliminated from dangling bonds of interface states on an interface between silicon substrate and silicon oxide films, so that no interface state is formed on the interface, whereby a sufficient reduction in amount of the interface states on the interface between silicon and silicon oxide is obtained, resulting in improvements in device performances and characteristics and reliability thereof as well as an improvement in the yield of the semiconductor devices.

In the second case (b), a furnace is heated up to a second annealing temperature of 480° C. which higher than the hydrogen-eliminating initiation temperature of 420° C. before a substrate is placed into the heated furnace, wherein the furnace has an inert gas atmosphere such as an air or a nitrogen atmosphere. With keeping the temperature of the furnace to be constant at the second annealing temperature, the inert atmosphere in the furnace is changed to a hydrogen atmosphere in order to start a hydrogen anneal to the substrate in the hydrogen atmosphere at the second annealing temperature. Changing the inert atmosphere to the hydrogen atmosphere is completed at a time "0". The hydrogen anneal is thus carried out in the hydrogen atmosphere with keeping the furnace temperature to be constant at the second annealing temperature of 480° C. for 120 minutes in a first time period between "b1" and "b2". The hydrogen anneal is further continued with a gradual and proportional decrease in the furnace temperature from 480° C. to 420° C. in a second time period between "b2" and "b3". The substrate is then placed in the furnace kept at the constant temperature of 420° C. for a time period from the time "b3 to a time "b4". At the time "b4", the hydrogen atmosphere in the furnace is changed into an inert atmosphere at 420° C. which is not higher than the hydrogen-eliminating initiation temperature, in order to discontinue the hydrogen anneal, before the substrate is taken out from the furnace which has the lower temperature than the hydrogen-elimination initiation temperature.

Namely, in the second case, the hydrogen anneal is carried out at 480° C. which is higher than the hydrogen-eliminating initiation temperature and then the furnace temperature remains controlled to be not higher than the hydrogen-eliminating initiation temperature after the hydrogen anneal has been carried out and until the substrate is taken out from the furnace, in order to prevent hydrogen from being eliminated from dangling bonds of interface states on an interface between silicon substrate and silicon oxide films, so that no interface state is formed on the interface, whereby a sufficient reduction in amount of the interface states on the interface between silicon and silicon oxide is obtained, resulting in improvements in device performances and characteristics and reliability thereof as well as an improvement in the yield of the semiconductor devices.

Figure 9:
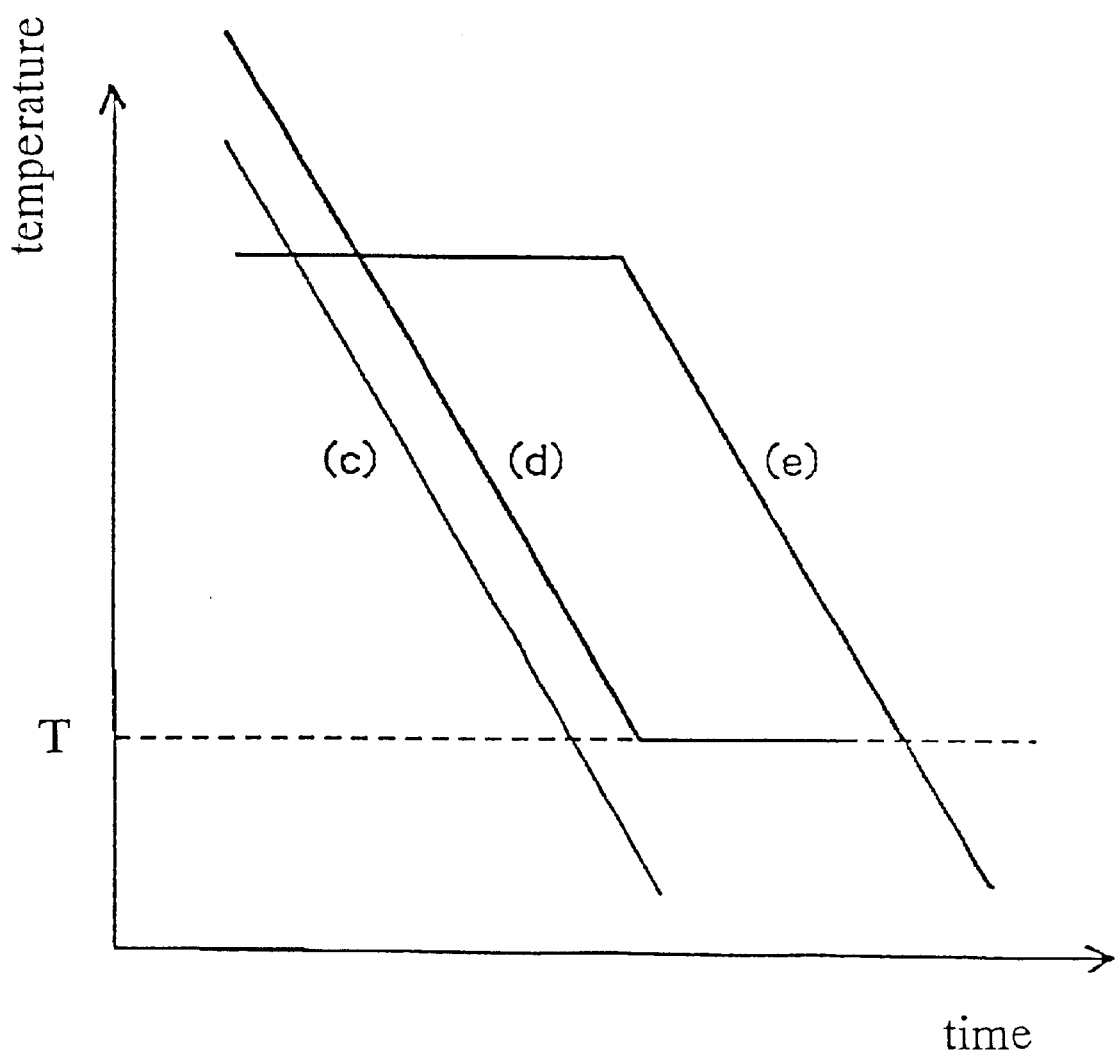
FIG. 9 is a diagram illustrative of a desirable sequence of hydrogen anneal temperature over time during when and after carrying out each of third, fourth and fifth novel methods of hydrogen anneal at three different temperature variation profiles in accordance with the present invention.

FIG. 9 is a diagram illustrative of a desirable sequence of hydrogen anneal temperature over time during when and after carrying out each of third, fourth and fifth novel methods of hydrogen anneal at three different temperature variation profiled in accordance with the present invention. The real line (c) represents a desirable sequence of hydrogen anneal temperature over time in a third case that the hydrogen anneal is carried out at a temperature higher than the hydrogen-eliminating initiation temperature. The other real line (d) represents a desirable sequence of hydrogen anneal temperature over time in a fourth case that the hydrogen anneal is carried out at a temperature higher than the hydrogen-eliminating initiation temperature. The still other real line (e) represents a desirable sequence of hydrogen anneal temperature over time in a fifth case that the hydrogen anneal is carried out at a temperature higher than the hydrogen-eliminating initiation temperature.

In the third case (c), a furnace is heated up to a third annealing temperature which is higher than the hydrogen-eliminating initiation temperature before a substrate is placed into the heated furnace, wherein the furnace has an inert gas atmosphere such as an air or a nitrogen atmosphere. With controlling the temperature of the furnace to be higher than the hydrogen-eliminating initiation temperature, the inert atmosphere in the furnace is changed to a hydrogen atmosphere in order to start a hydrogen anneal to the substrate in the hydrogen atmosphere at the temperature higher than the hydrogen-eliminating initiation temperature. The hydrogen anneal is thus carried out in the hydrogen atmosphere with a gradual and proportional drop of the furnace temperature from the higher temperature than the hydrogen-eliminating initiation temperature. After the furnace temperature is dropped to be lower than the hydrogen-eliminating initiation temperature, then the hydrogen atmosphere in the furnace is changed into an inert atmosphere with a continuous gradual and proportional drop of the furnace temperature, in order to discontinue the hydrogen anneal, before the substrate is taken out from the furnace which has the lower temperature than the hydrogen-eliminating initiation temperature.

Namely, in the third case, the hydrogen anneal is started at the higher temperature than the hydrogen-eliminating initiation temperature and the hydrogen anneal is carried out with the gradual and proportional drop of the furnace temperature. Thereafter, the furnace temperature is continued to be gradually and proportionally dropped further from the hydrogen-eliminating initiation temperature after the hydrogen anneal has been carried out and until the substrate is taken out from the furnace, in order to prevent hydrogen from being eliminated from dangling bonds of interface states on an interface between silicon substrate and silicon oxide films, so that no interface state is formed on the interface, whereby a sufficient reduction in amount of the interface states on the interface between silicon and silicon oxide is obtained, resulting in improvements in device performances and characteristics and reliability thereof as well as an improvement in the yield of the semiconductor devices.

In the fourth case (d), a furnace is heated up to a fourth annealing temperature which is higher than the hydrogen-eliminating initiation temperature before a substrate is placed into the heated furnace, wherein the furnace has an inert gas atmosphere such as an air or a nitrogen atmosphere. With controlling the temperature of the furnace to be higher than the hydrogen-eliminating initiation temperature, the inert atmosphere in the furnace is changed to a hydrogen atmosphere in order to start a hydrogen anneal to the substrate in the hydrogen atmosphere at the temperature higher than the hydrogen-eliminating initiation temperature. The hydrogen anneal is thus carried out in the hydrogen atmosphere with a gradual and proportional drop of the furnace temperature from the higher temperature than the hydrogen-eliminating initiation temperature. After the furnace temperature is dropped to the hydrogen-eliminating initiation temperature, the substrate is placed in the furnace controlled at the hydrogen-eliminating initiation temperature. Thereafter, the hydrogen atmosphere in the furnace is changed into an inert atmosphere with keeping the furnace temperature at the hydrogen-eliminating initiation temperature, in order to discontinue the hydrogen anneal, before the substrate is taken out from the furnace which has the temperature not higher than the hydrogen-eliminating initiation temperature.

Namely, in the fourth case, the hydrogen anneal is started at the higher temperature than the hydrogen-eliminating initiation temperature and the hydrogen anneal is carried out with the gradual and proportional drop of the furnace temperature. Thereafter, the furnace temperature is kept to be not higher than the hydrogen-eliminating initiation temperature after the hydrogen anneal has been carried out and until the substrate is taken out from the furnace, in order to prevent hydrogen from being eliminated from dangling bonds of interface states on an interface between silicon substrate and silicon oxide films, so that no interface state is formed on the interface, whereby a sufficient reduction in amount of the interface states on the interface between silicon and silicon oxide is obtained, resulting in improvements in device performances and characteristics and reliability thereof as well as an improvement in the yield of the semiconductor devices.

In the fifth case (e), a furnace is heated up to a fifth annealing temperature which is constant and higher than the hydrogen-eliminating initiation temperature before a substrate is placed into the heated furnace, wherein the furnace has an inert gas atmosphere such as an air or a nitrogen atmosphere. With keeping the temperature of the furnace at the constant temperature of the fifth annealing temperature which is higher than the hydrogen-eliminating initiation temperature, the inert atmosphere in the furnace is changed to a hydrogen atmosphere in order to start a hydrogen anneal to the substrate in the hydrogen atmosphere at the constant fifth annealing temperature higher than the hydrogen-eliminating initiation temperature. The hydrogen anneal is thus carried out in the hydrogen atmosphere with keeping the furnace temperature at the fifth constant annealing temperature which is higher than the hydrogen-eliminating initiation temperature. Thereafter, the hydrogen anneal is continued with a gradual and proportional drop of the furnace temperature from the fifth annealing temperature. After the furnace temperature is dropped to be lower than the hydrogen-eliminating initiation temperature, then the hydrogen atmosphere in the furnace is changed into an inert atmosphere with a continuous gradual and proportional drop of the furnace temperature, in order to discontinue the hydrogen anneal, before the substrate is taken out form the furnace which has the lower temperature than the hydrogen-eliminating initiation temperature.

Namely, in the fifth case, the hydrogen anneal is started at the higher temperature than the hydrogen-eliminating initiation temperature and the hydrogen anneal is carried out in a first annealing time period with keeping the furnace temperature to be the fifth annealing temperature and subsequently the hydrogen anneal is continued in a second annealing time period with the gradual and proportional drop of the furnace temperature. Thereafter, the furnace temperature is continued to be gradually and proportionally dropped further from the hydrogen-eliminating initiation temperature after the hydrogen anneal has been carried out and until the substrate is taken out from the furnace, in order to prevent hydrogen from being eliminated from dangling bonds of interface states on an interface between silicon substrate and silicon oxide films, so that no interface state is formed on the interface, whereby a sufficient reduction in amount of the interface states on the interface between silicon and silicon oxide is obtained resulting in improvements in device performances and characteristics and reliability thereof as well as an improvement in the yield of the semiconductor devices.

On the basis of safety, it is preferable that the substrate is placed into or taken out form the furnace under the condition of the inert atmosphere. Namely, the inert atmosphere is introduced into the furnace before the substrate is placed into the furnace. After the substrate has been placed in the furnace, then the inert atmosphere is changed into the hydrogen atmosphere to start the hydrogen anneal. After the hydrogen atmosphere in the furnace is changed into the inert atmosphere, then the substrate is taken out from the furnace.

It is, however, possible to modify the above novel method so that the substrate is placed into or taken out from the hydrogen atmosphere in the furnace without changing the hydrogen atmosphere into the inert atmosphere.

The first and second novel method of hydrogen anneal shown in FIG. 8 are most convenient for practicing the present invention. It is relatively easy to control the furnace temperature to be constant at the temperatures which are higher than the hydrogen-eliminating initiation temperature, whereby it is possible to have the device performance uniform and also possible to improve the yield of the semiconductor devices. Further, after the furnace temperature is dropped to be not higher than the hydrogen-eliminating initiation temperature, then the furnace temperature is kept at a constant temperature lower than the hydrogen-eliminating initiation temperature before the hydrogen atmosphere is changed to the inert atmosphere for allowing the substrate to be taken out from the furnace at a constant temperature lower than the hydrogen-eliminating initiation temperature. Keeping the furnace temperature at the constant temperature lower than the hydrogen-eliminating initiation temperature contributes to have the substrate temperature uniform when the substrate is taken out from the furnace. As a result, it is possible to reduce a difference between the actual substrate temperature and a detected temperature. It is also possible to suppress a variation in temperature of the substrate over position. It is also possible to suppress a difference in annealing effect between different furnaces.

If the interface comprises an interface between silicon and silicon oxide, then the hydrogen-eliminating initiation temperature is about 420° C. In this case, the hydrogen anneal is carried out at a higher temperature than this hydrogen-eliminating initiation temperature. After the furnace temperature is dropped to be not higher than this hydrogen-eliminating initiation temperature, then the hydrogen atmosphere is changed to the inert atmosphere to discontinue the hydrogen anneal for allowing the substrate to be taken out from the furnace at the temperature which is not higher than the hydrogen-eliminating initiation temperature.

The upper limit of the hydrogen anneal temperature is decided to avoid any substantive damage to the device formed on the substrate. If, for example, an interconnection material is used which has a relatively low melting point, then it is preferable that the hydrogen anneal is carried out at a temperature controlled to be lower than this melting point. If the substrate has an aluminum interconnection, it is possible that the hydrogen anneal temperature is controlled to be lower than 660° C. which is the melting point of aluminum. Namely, a preferable range of the hydrogen anneal temperature is higher 420° C. and lower than 660° C. More preferable range thereof is 430° C.–500° C. There is no problem to have the hydrogen anneal temperature vary in the above preferable range.

It is also preferable to decide the annealing time under conditions of the hydrogen anneal temperature and temperature variation profile and the structure of the substrate, so that the hydrogen anneal is carried out until there is saturated the reduction in the interface states by having hydrogen terminate dangling bonds of the interface states.

In the above description, the novel method of hydrogen anneal is applied to the silicon substrate having the interface between silicon and silicon oxide. The novel method of hydrogen anneal in accordance with the present invention is also applicable to other cases. For example, the substrate may be made of GaAs, InP, Ge, C, SiC, or ZnSe, whilst the insulator may be insulating martial such as SiON, SiN, or $Al_2O_3$ or may be dielectric such as $Ta_2O_5$, BST or PZT. In any event, the novel method of hydrogen anneal in accordance with the present invention is applicable in order to reduce the interface states on the interface between two different substances.

Further, the novel method of hydrogen anneal in accordance with the present invention is particularly effective to the DRAM having the top and bottom capacitive electrodes made of either polysilicon or a metal martial capable of absorbing hydrogen and also having a film non-permeable to hydrogen such as a silicon nitride film serving as a diffusion barrier to hydrogen. Namely, the novel method of hydrogen anneal in accordance with the present invention is particularly effective to the DRAMs as shown in FIGS. 1A through 1C and FIG. 2. Other hydrogen non-permeable films are, for example, nitride films such as SiN film oxo-nitride films such as SiON film, refractory metal films such as Mo film, W film, Ta film, Ti film and silicide films such as $MoSi_2$ film $WSi_2$ film $TaSi_2$ film, $TiSi_2$ film. Further, the novel method of hydrogen anneal in accordance with the present invention is particularly effective to the DRAMS having the capacitor over bit line structure. Furthermore, the novel method of hydrogen anneal in accordance with the present invention is particularly effective to the DRAMs having the barrier metal layer such as Ti or TiN.

In addition, the novel method of hydrogen anneal in accordance with the present invention is applicable to not only the DRAM but also any other semiconductor devices, for example, logic device combined with the DRAM or semiconductor integrated circuits having a hydrogen non-permeable film serving as a hydrogen diffusion barrier.

Figure 2:
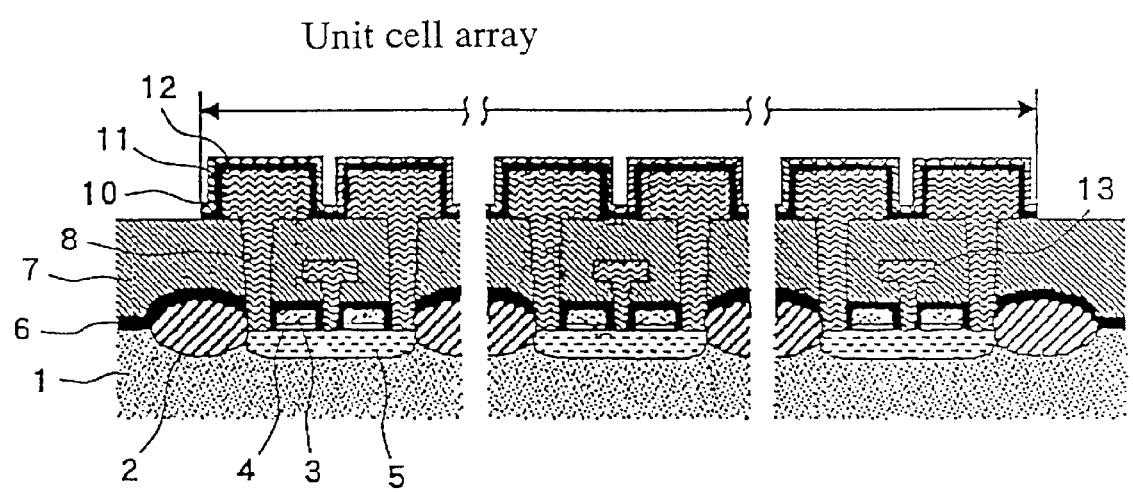
FIG. 2 is a fragmentary cross sectional elevation view illustrative of a stacked DRAM having a self-aligned contact structure and a capacitor over bit line structure in a unit of one of the capacitive top electrodes.
Figure 3:
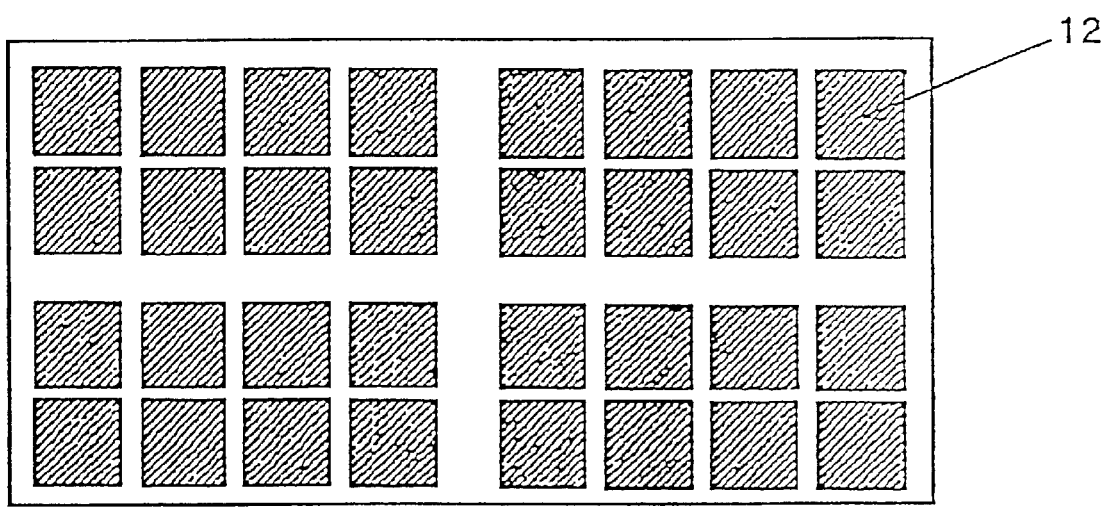
FIG. 3 is a fragmentary plan view illustrative of a DRAM chip of FIG. 2.
Figure 4:
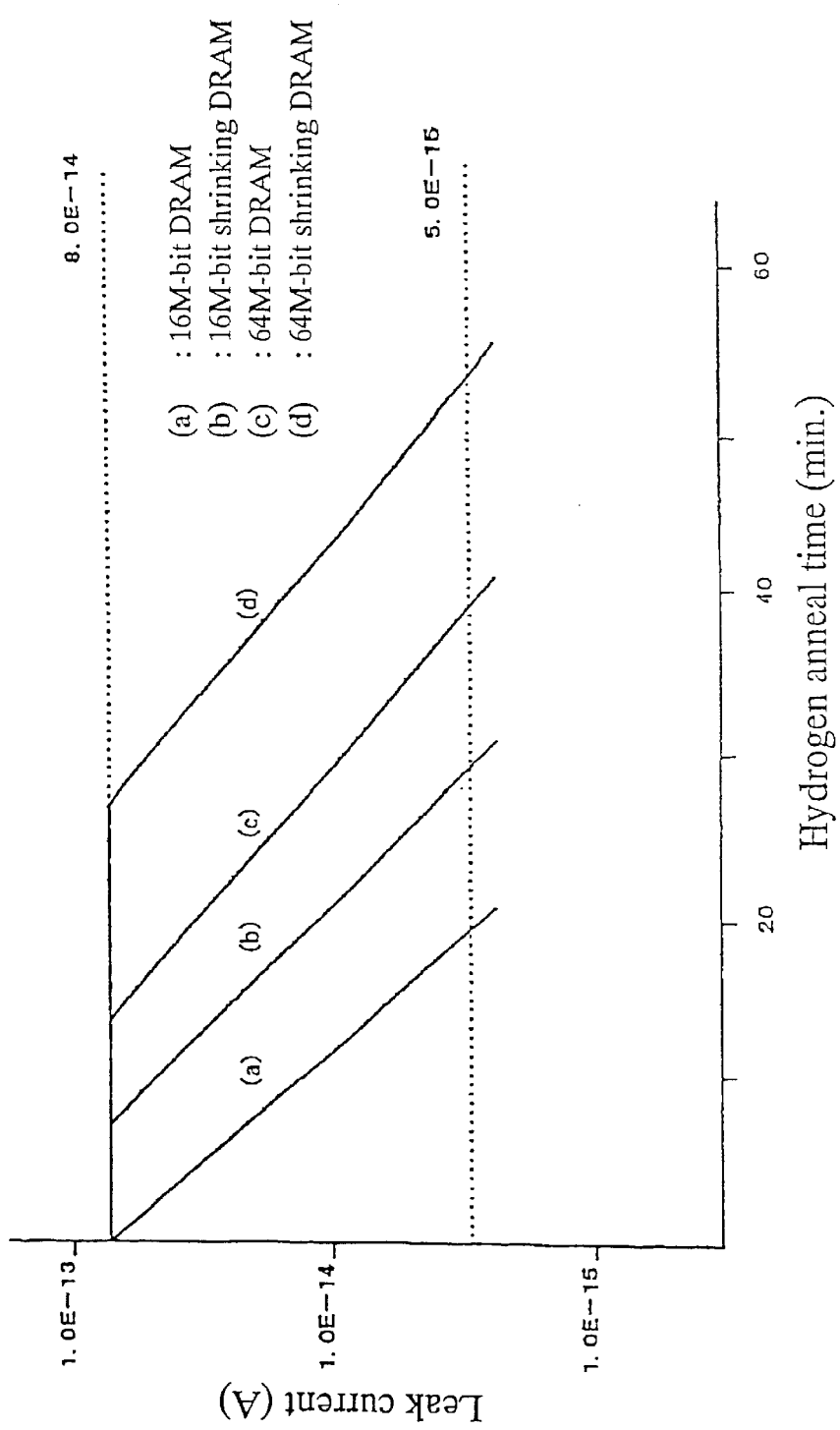
FIG. 4 is a diagram illustrative of a variation in leak current over a hydrogen anneal time when a silicon substrate of FIG. 1 is subjected to a hydrogen anneal in the conventional method.
Figure 5:
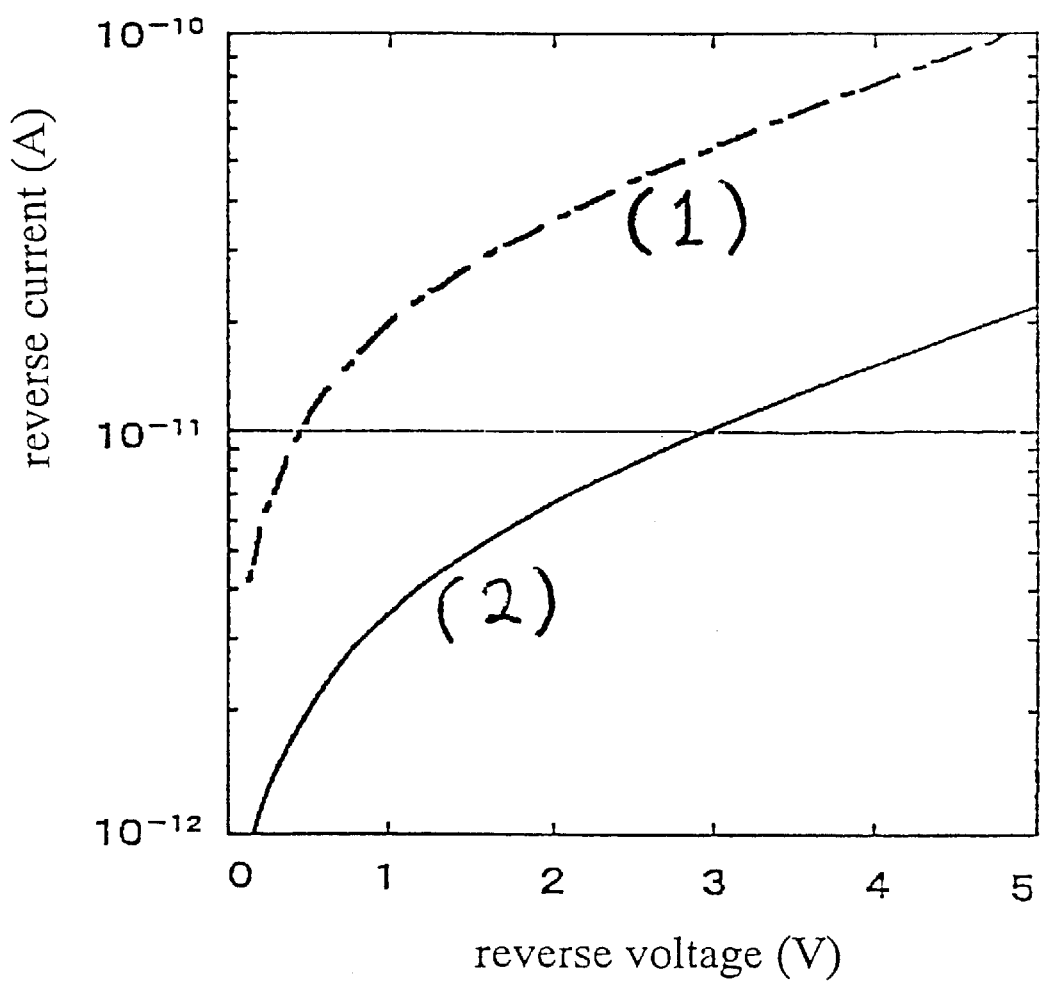
FIG. 5 is a diagram illustrative of variation in reverse current versus reverse voltage of each of a first type stacked DRAM (1) having a self-aligned contact structure and a second type stacked DRAM (2) free of any self-aligned contact structure after the first and second type DRAMs have been subjected to the hydrogen anneals.

First and second examples of the above present invention will be described with comparison to first through fourth comparative examples of the above conventional method with reference to the drawing. In the first and second examples and the fifth to fourth comparative examples, the DRAM of FIG. 2 is used. The first example is carried out with the temperature sequence along the above described first case (a) shown in FIG. 8. The second example is carried out with the temperature sequence along the above described second case (b) shown in FIG. 8. The first comparative example is carried out by keeping the furnace temperature to be constant at 400° C. for 240 minutes in accordance with the conventional hydrogen anneal method. The second comparative example is carried out by keeping the furnace temperature to be constant at 420° C. for 240 minutes in accordance with the conventional hydrogen anneal method. The third comparative example is carried out by keeping the furnace temperature to be constant at 435° C. for 420 minutes in accordance with the conventional hydrogen anneal method. The fourth comparative example is carried out by keeping the furnace temperature to be constant at 500° C. for 240 minutes in accordance with the conventional hydrogen anneal method.

Namely, in the first example, a furnace is heated up to a first annealing temperature of 450° C. which is higher than the hydrogen-eliminating initiation temperature of 420° C. before a substrate is placed into the heated furnace, wherein the furnace has an inert gas atmosphere such as an air or a nitrogen atmosphere. With keeping the temperature of the furnace to be constant at the first annealing temperature, the inert atmosphere in the furnace is changed to a hydrogen atmosphere in order to start a hydrogen anneal to the substrate in the hydrogen atmosphere at the first annealing temperature. Changing the inert atmosphere to the hydrogen atmosphere is completed at a time "0". The hydrogen anneal is thus carried out in the hydrogen atmosphere with keeping the furnace temperature to be constant at the first annealing temperature of 450° C. for 240 minutes in a first time period between "a1" and "a2". The hydrogen anneal is further continued with a gradual and proportional decrease in the furnace temperature from 450° C. to 420° C. in a second time period between "a2" and a "a3". The substrate is then placed in the furnace kept at the constant temperature of 420° C. for a time period from the time "a3 to a time "a4". At the time "a4", the hydrogen atmosphere in the furnace is changed into and inert atmosphere at 420° C. which is not higher than the hydrogen-eliminating initiation temperature, in order to discontinue the hydrogen anneal, before the substrate is taken out from the furnace which has the lower temperature than the hydrogen-eliminating initiation temperature.

In the second example, a furnace is heated up to a second annealing temperature of 480° C. which is higher than the hydrogen-eliminating initiation temperature of 420° C. before a substrate is placed into the heated furnace, wherein the furnace has an inert gas atmosphere such as an air or a nitrogen atmosphere. With keeping the temperature of the furnace to be constant at the second annealing temperature, the inert atmosphere in the furnace is changed to a hydrogen atmosphere in order to start a hydrogen anneal to the substrate in the hydrogen atmosphere at the second annealing temperature. Changing the inert atmosphere to the hydrogen atmosphere is completed at a time "0". The hydrogen anneal is thus carried out in the hydrogen atmosphere with keeping the furnace temperature to be constant at the second annealing temperature of 480° C. for 120 minutes in a first time period between "b1" and "b2". The hydrogen anneal is further continued with a gradual and proportional decrease in the furnace temperature from 480° C. to 420° C. in a second time period between "b2" and "b3". The substrate is then placed in the furnace kept at the constant temperature of 420° C. for a time period from the time "b3 to a time "b4". At the time "4", the hydrogen atmosphere in the furnace is changed into an inert atmosphere at 420° C. which is not higher than the hydrogen-eliminating initiation temperature, in order to discontinue the hydrogen anneal, before the substrate is taken out form the furnace which has the lower temperature than the hydrogen-eliminating initiation temperature.

Figure 10:
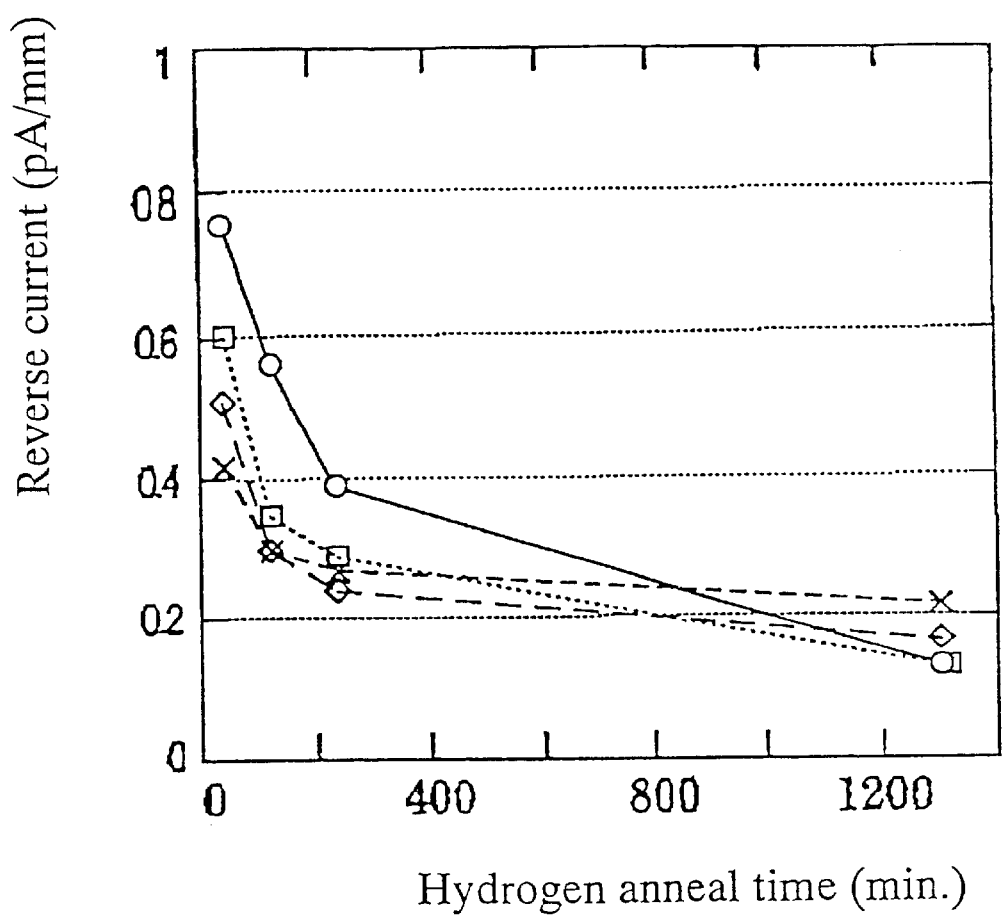
FIG. 10 is a diagram illustrative of variations in reverse current over hydrogen anneal time when the substrate of FIG. 2 is subjected to the conventional hydrogen anneal methods in the first, second, third and fourth comparative examples.

FIG. 10 is a diagram illustrative of variations in reverse current over hydrogen anneal time when the substrate of FIG. 2 is subjected to the conventional hydrogen anneal methods in the first, second, third and fourth comparative examples.

In the first comparative example, the hydrogen anneal is carried out at a hydrogen-nitrogen atmosphere of a hydrogen to nitrogen ratio of 1:1 at a constant temperature of 400° C. under an atmospheric pressure. In order to measure the reverse current, a reverse bias is applied to a p-n junction between contacts and substrate, where the contacts have a diameter of 0.5 micrometers and are aligned to form an array. The relative low temperature hydrogen anneal at 400° C. causes an extremely slow hydrogen diffusion.

In the second comparative example, the hydrogen anneal is carried out at a hydrogen-nitrogen atmosphere of a hydrogen to nitrogen ratio of 1:1 at a constant temperature of 420° C. under an atmospheric pressure. In order to measure the reverse current, a reverse bias is applied to a p-n junction between contacts and substrate, where the contacts have a diameter of 0.5 micrometers and are aligned to form an array. The relative low temperature hydrogen anneal at 420° C. causes that hydrogen diffusion rate is not so slow but the finally reduced leak current is not lower than that of the first comparative example.

In the third comparative example, the hydrogen anneal is carried out at a hydrogen-nitrogen atmosphere of a hydrogen to nitrogen ratio of 1:1 at a constant temperature of 435° C. under an atmospheric pressure. In order to measure the reverse current, a reverse bias is applied to a p-n junction between contacts and substrate, where the contacts have a diameter of 0.5 micrometers and are aligned to form an array. The relative low temperature hydrogen anneal at 435° C. causes that hydrogen diffusion rate is fast but the finally reduced leak current is higher than that of the first comparative example.

In the fourth comparative example, the hydrogen anneal is carried out at a hydrogen-nitrogen atmosphere of a hydrogen to nitrogen ratio of 1:1 at a constant temperature of 450° C. under an atmospheric pressure. In order to measure the reverse current, a reverse bias is applied to a p-n junction between contacts and substrate, where the contacts have a diameter of 0.5 micrometers and are aligned to form an array. The relative low temperature hydrogen anneal at 450° C. causes that hydrogen diffusion rate is fast but the finally reduced leak current is higher than that of the first comparative example.

Figure 11:
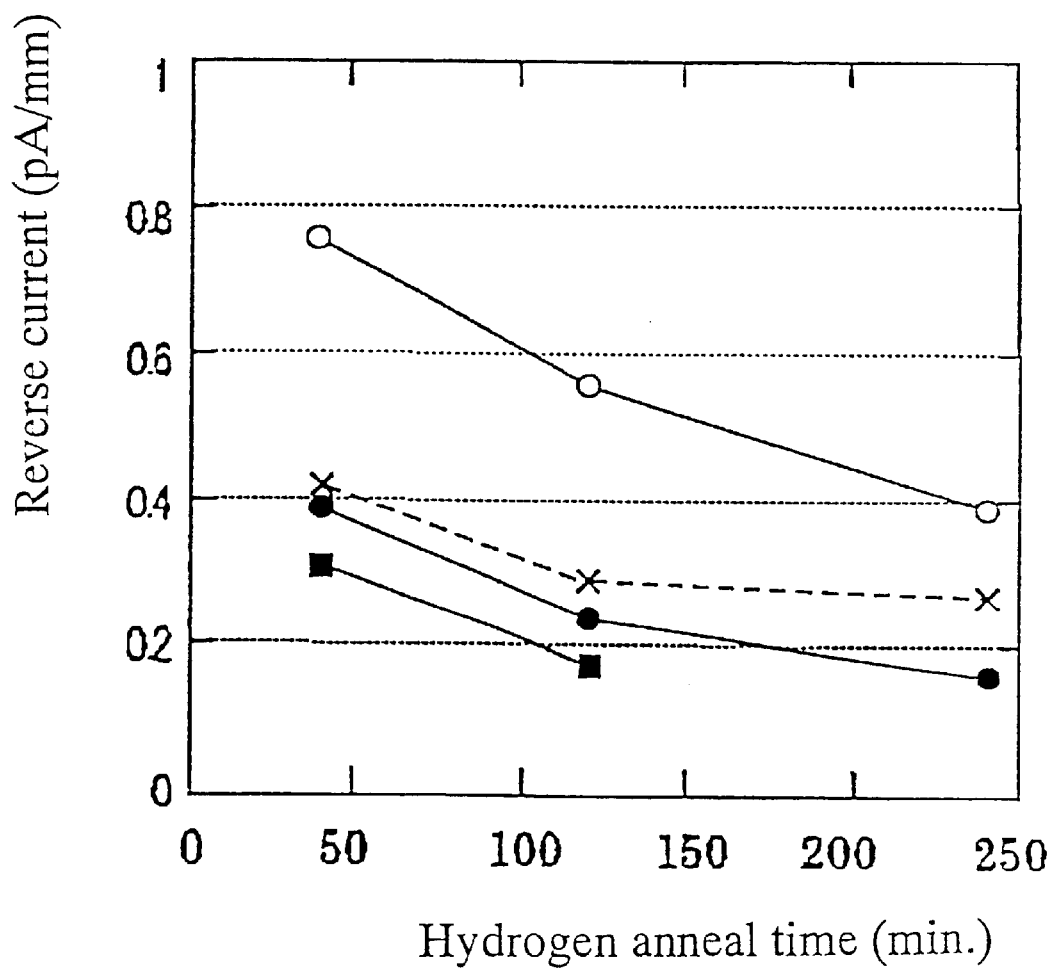
FIG. 11 is a diagram illustrative of variations in reverse current over hydrogen anneal time when the substrate of FIG. 2 is subjected to the novel hydrogen anneal methods of FIG. 8 in the first and second example of the present invention and also subjected to the conventional hydrogen anneal methods in the first and fourth comparative examples.

FIG. 11 is a diagram illustrative of variations in reverse current over hydrogen anneal time when the substrate of FIG. 2 is subjected to the novel hydrogen anneal methods of FIG. 8 in the first and second example of the present invention and also subjected to the conventional hydrogen anneal methods in the first and fourth comparative examples. The evaluations on the leak current are carried out under the same conditions as in the first to fourth comparative examples of FIG. 10. The first novel hydrogen anneal method of the first example of the present invention causes that hydrogen diffusion rate is faster than those of the conventional methods. The second novel hydrogen anneal method of the second example of the present invention causes that hydrogen diffusion rate is faster than that of the first example and much faster than those of the conventional methods.

Whereas modifications of the present invention will be apparent to a person having ordinary skill in the art, to which the invention pertains, it is to be understood that embodiments as shown and described in a limiting sense. Accordingly, it is to be intended to cover by claims all modifications which fall within the spirit and scope of the present invention.

What is claimed is:

1. A method of controlling a temperature of a furnace to be not higher than a hydrogen-eliminating initiation temperature until a substrate having an interface between different materials is taken out from said furnace after a hydrogen anneal is carried out in said furnace with an anneal temperature profile which includes at least a higher temperature than said hydrogen-eliminating initiation temperature.

2. The method as claimed in claim 1, wherein said temperature of said furnace is decreased to be not higher than said hydrogen-eliminating initiation temperature before a hydrogen atmosphere in said furnace is changed to an inert atmosphere prior to taking said substrate out from said furnace.

3. The method as claimed in claim 1, wherein said temperature of said furnace is kept constant at said hydrogen-eliminating initiation temperature until said substrate is taken out from said furnace after said hydrogen anneal is carried out.

4. The method as claimed in claim 1, wherein said temperature of said furnace is decreased from said hydrogen-eliminating initiation temperature until said substrate is taken out from said furnace after said hydrogen anneal is carried out.

5. The method as claimed in claim 4, wherein said temperature of said furnace is decreased in proportion to time.

6. The method as claimed in claim 1, wherein said anneal temperature profile includes a time period during when said temperature of said furnace is kept to be higher than said hydrogen-eliminating initiation temperature.

7. The method as claimed in claim 1, wherein said anneal temperature profile includes a first time period during when said temperature of said furnace is kept constant at a higher temperature than said hydrogen-eliminating initiation temperature and a second time period during when said temperature of said furnace is decreased to be not higher than said hydrogen-eliminating initiation temperature.

8. The method as claimed in claim 7, wherein said temperature of said furnace is decreased and maintained at said hydrogen-eliminating initiation temperature.

9. The method as claimed in claim 8, wherein said temperature of said furnace is maintained at said hydrogen-eliminating initiation temperature for a predetermined time period before a hydrogen atmosphere in said furnace is changed to an inert atmosphere prior to taking said substrate out from said furnace.

10. The method as claimed in claim 7, wherein said temperature of said furnace is decreased from said higher temperature than said hydrogen-eliminating initiation temperature to a lower temperature than said hydrogen-eliminating initiation temperature.

11. The method as claimed in claim 10, wherein said temperature of said furnace is decreased in proportion to time.

12. The method as claimed in claim 1, wherein said interface is an interface between semiconductor and insulator.

13. The method as claimed in claim 12, wherein said interface is an interface between silicon and silicon oxide.

14. The method as claimed in claim 1, wherein said substrate has at least a film made of a material capable of absorbing hydrogen.

15. The method as claimed in claim 1, wherein said substrate has at least a film made of a material non-permeable to hydrogen serving as a diffusion barrier to hydrogen.

16. A method of hydrogen annealing a semiconductor substrate by controlling the substrate temperature to be not higher than a hydrogen-eliminating initiation temperature of about 420° C. until the substrate having an interface between different materials is taken out from said furnace after a hydrogen anneal is carried out in said furnace with an anneal temperature profile which includes at least a higher temperature than said hydrogen-eliminating initiation temperature.

17. A method of carrying out a hydrogen anneal to a substrate having an interface between different materials provided that an annealing temperature is maintained higher than a hydrogen-eliminating initiation temperature, wherein a temperature of a furnace is controlled to be not higher than said hydrogen-eliminating initiation temperature until said substrate is taken out from said furnace after said hydrogen anneal is carried out.

18. The method as claimed in claim 17, wherein said temperature of said furnace is decreased to be not higher than said hydrogen-eliminating initiation temperature before a hydrogen atmosphere in said furnace is change to an inert atmosphere prior to taking said substrate out from said furnace.

19. The method as claimed in claim 17, wherein said temperature of said furnace is kept constant at said hydrogen-eliminating initiation temperature until said substrate is taken out from said furnace after said hydrogen anneal is carried out.

20. The method as claimed in claim 17, wherein said temperature of said furnace is decreased from said hydrogen-eliminating initiation temperature until said substrate is taken out from said furnace after said hydrogen anneal is carried out.

21. The method as claimed in claim 20, wherein said temperature of said furnace is decreased in proportion to time.

22. The method as claimed in claim 17, wherein said anneal temperature profile includes a time period during when said temperature of said furnace is kept to be higher than said hydrogen-eliminating initiation temperature.

23. The method as claimed in claim 17, wherein said anneal temperature profile includes a first time period during when said temperature of said furnace is kept constant at a higher temperature than said hydrogen-eliminating initiation temperature and a second time period during when said temperature of said furnace is decreased to be not higher than said hydrogen-eliminating initiation temperature.

24. The method as claimed in claim 23, wherein said temperature of said furnace is decreased and maintained at said hydrogen-eliminating initiation temperature.

25. The method as claimed in claim 24, wherein said temperature of said furnace is maintained at said hydrogen-eliminating initiation temperature for a predetermined time period before a hydrogen atmosphere in said furnace is changed to an inert atmosphere prior to taking said substrate out from said furnace.

26. The method as claimed in claim 23, wherein said temperature of said furnace is decreased from said higher temperature than said hydrogen-eliminating initiation temperature to a lower temperature than said hydrogen-eliminating initiation temperature.

27. The method as claimed in claim 26, wherein said temperature of said furnace is decreased in proportion to time.

28. The method as claimed in claim 17, wherein said interface is an interface between silicon and silicon oxide.

29. The method as claimed in claim 28, wherein said interface is an interface between silicon and silicon oxide.

30. The method as claimed in claim 17, wherein said substrate has at least a film made of a material capable of absorbing hydrogen.

31. The method as claimed in claim 17, wherein said substrate has at least a film made of a material non-permeable to hydrogen serving as a diffusion barrier to hydrogen.

32. The method as claimed in claim 1, wherein said hydrogen-eliminating initiation temperature is about 420° C.

33. The method as claimed in claim 17, wherein said hydrogen-eliminating initiation temperature is about 420° C.

* * * * *